United States Patent
Liu et al.

(10) Patent No.: US 10,879,166 B2
(45) Date of Patent: Dec. 29, 2020

(54) PACKAGE STRUCTURE HAVING REDISTRIBUTION STRUCTURE WITH PHOTOSENSITIVE AND NON-PHOTOSENSITIVE DIELECTRIC MATERIALS AND FABRICATING METHOD THEREOF

(71) Applicant: Taiwan Semiconductor Manufacturing Co., Ltd., Hsinchu (TW)

(72) Inventors: Zi-Jheng Liu, Taoyuan (TW); Hung-Jui Kuo, Hsinchu (TW); Ming-Tan Lee, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/016,669

(22) Filed: Jun. 25, 2018

(65) Prior Publication Data
US 2019/0393150 A1   Dec. 26, 2019

(51) Int. Cl.
| H01L 23/52 | (2006.01) |
| H01L 21/76 | (2006.01) |
| H01L 23/522 | (2006.01) |
| H01L 23/00 | (2006.01) |
| H01L 21/768 | (2006.01) |

(Continued)

(52) U.S. Cl.
CPC .......... *H01L 23/5226* (2013.01); *H01L 21/56* (2013.01); *H01L 21/76843* (2013.01); *H01L 21/76873* (2013.01); *H01L 21/76876* (2013.01); *H01L 21/76877* (2013.01); *H01L 23/3121* (2013.01); *H01L 24/09* (2013.01); *H01L 24/17* (2013.01); *H01L 2224/02372* (2013.01)

(58) Field of Classification Search
CPC ................. H01L 23/5226; H01L 21/56; H01L 21/76843; H01L 21/76873; H01L 21/76876; H01L 21/76877; H01L 23/3121; H01L 24/09; H01L 24/17; H01L 2224/02372
USPC ....................................................... 257/692
See application file for complete search history.

(56) References Cited

U.S. PATENT DOCUMENTS

| 8,987,922 B2 | 3/2015 | Yu et al. |
| 9,000,584 B2 | 4/2015 | Lin et al. |
| 9,048,222 B2 | 6/2015 | Hung et al. |

(Continued)

*Primary Examiner* — Didarul A Mazumder
(74) *Attorney, Agent, or Firm* — JCIPRNET

(57) ABSTRACT

A semiconductor package including a substrate and a redistribution structure is provided. The substrate has at least one contact. The redistribution structure is disposed on the substrate and electrically connected to the at least one contact. The redistribution structure includes a plurality of redistribution layers, and each of the redistribution layers includes a conductive material layer, a first dielectric material layer and a second dielectric material layer. The conductive material layer has via portions and body portions located on the via portions. The first dielectric material layer is surrounding the via portions of the conductive material layer. The second dielectric material layer is disposed on the first dielectric material layer and surrounding the body portions of the conductive material layer, wherein a material of the second dielectric material layer is different than a material of the first dielectric material layer.

20 Claims, 9 Drawing Sheets

(51) Int. Cl.
    *H01L 23/31*     (2006.01)
    *H01L 21/56*     (2006.01)

(56) References Cited

U.S. PATENT DOCUMENTS

| | | |
|---|---|---|
| 9,048,233 B2 | 6/2015 | Wu et al. |
| 9,064,874 B2 | 6/2015 | Edelstein et al. |
| 9,111,949 B2 | 8/2015 | Yu et al. |
| 9,196,532 B2 | 11/2015 | Tu et al. |
| 9,196,559 B2 | 11/2015 | Tsai et al. |
| 9,257,333 B2 | 2/2016 | Lu et al. |
| 9,263,511 B2 | 2/2016 | Yu et al. |
| 9,263,839 B2 | 2/2016 | Chen et al. |
| 9,275,924 B2 | 3/2016 | Wang et al. |
| 9,275,925 B2 | 3/2016 | Chen et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,157,864 B1 * | 12/2018 | Yu .................... H01L 24/20 |
| 2011/0221055 A1 * | 9/2011 | Lin .................. H01L 21/563 |
| | | 257/692 |
| 2014/0264930 A1 * | 9/2014 | Yu .................... H01L 24/19 |
| | | 257/774 |
| 2015/0228596 A1 * | 8/2015 | Hu .................... H01L 24/03 |
| | | 257/737 |
| 2015/0380334 A1 * | 12/2015 | Hu .................... H01L 24/14 |
| | | 257/712 |
| 2016/0056126 A1 * | 2/2016 | Yu .................. H01L 21/565 |
| | | 257/737 |
| 2018/0374696 A1 * | 12/2018 | Chen ................ H01L 23/13 |
| 2019/0287820 A1 * | 9/2019 | Huang ............ H01L 23/3114 |

* cited by examiner

PACKAGE STRUCTURE HAVING REDISTRIBUTION STRUCTURE WITH PHOTOSENSITIVE AND NON-PHOTOSENSITIVE DIELECTRIC MATERIALS AND FABRICATING METHOD THEREOF

BACKGROUND

Packaging technologies for integrated circuits involve encapsulating an integrated circuit (IC) die in encapsulation material and building the required redistribution layer. The formation of fine-pitch redistribution layers allows for fabricating smaller packages with high integration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
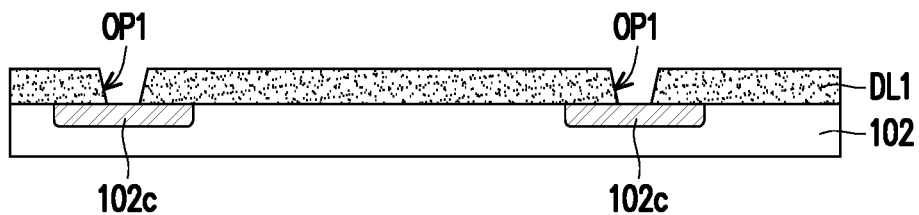
FIG. 1A to FIG. 1I are schematic cross-sectional views of various stages in a method of fabricating a semiconductor package according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1I are schematic cross-sectional views of various stages in a method of fabricating a semiconductor package according to some exemplary embodiments of the present disclosure. Referring to FIG. 1A, a substrate 102 having a plurality of contacts 102C is provided. In some embodiments, the substrate 102 may include one or more semiconductor chips or plural dies of a semiconductor wafer or a reconstituted wafer. In certain embodiments, the substrate 102 is a reconstituted wafer including a plurality of dies molded in a molding compound. In some embodiments, the contacts 104 are contact pads or conductive pads of the die(s). In some embodiments, the substrate 102 may be a monocrystalline semiconductor substrate such as a silicon substrate, a silicon-on-insulator (SOI) substrate or a germanium-on-insulator (GOI) substrate, for example. In accordance with the embodiments, the semiconductor substrate may include other conductive layers, doped regions or other semiconductor elements, such as transistors, diodes or the like. The embodiments are intended for illustration purposes but not intended to limit the scope of the present disclosure.

As illustrated in FIG. 1A, a first dielectric material layer DL1 is formed over the substrate 102 to cover the substrate 102. The first dielectric material layer DL1 is formed with a plurality of first openings OP1 that partially expose the contacts 102C of the substrate 102. In some embodiments, the first dielectric material layer DL1 is formed by first forming a first dielectric material (not shown) on the substrate 102, then patterning the first dielectric material to form the first dielectric material layer DL1 having the first openings OP1. In some embodiments, the first dielectric material layer DL1 (first dielectric material) is formed by a coating process such as spin-coating process, or a deposition process including a chemical vapor deposition (CVD) process. In certain embodiments, the first dielectric material layer DL1 is a photosensitive dielectric material layer. For example, the first dielectric material layer DL1 may include photosensitive dielectric materials such as Si-containing oxides (silicone polymers) or Ti-containing oxides (Titania polymers).

Figure 1B:
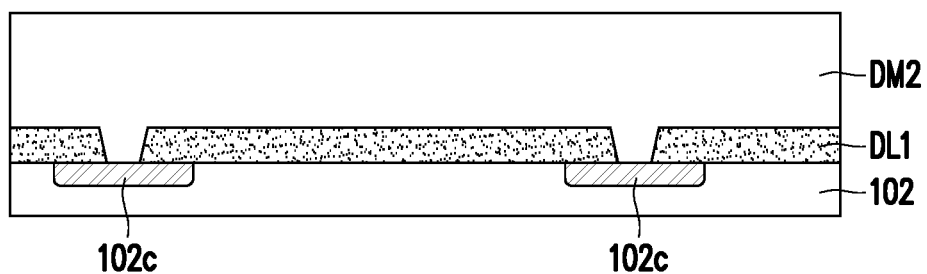

Referring to FIG. 1B, after forming the first dielectric material layer DL1, a second dielectric material DM2 is formed over the first dielectric material layer DL1. In some embodiments, the second dielectric material DM2 is formed on the first dielectric material layer DL1 by a coating process such as spin-coating process, or a lamination process, or a deposition process including a chemical vapor deposition (CVD) process. In certain embodiments, the second dielectric material DM2 is formed on the first dielectric material layer DL1 by the lamination process to improve the planarization of the structure. In some embodiments, the second dielectric material DM2 is different than the first dielectric material. For example, the second dielectric material DM2 can be a photosensitive or non-photosensitive dielectric material such as polyimide or polybenzoxazole, or any other non-photosensitive wet-film or dry-film dielectric materials. In some embodiments, the second dielectric material DM2 can be processed through coating/curing or lamination/curing processes, while the exposure process is not necessary.

Figure 1C:
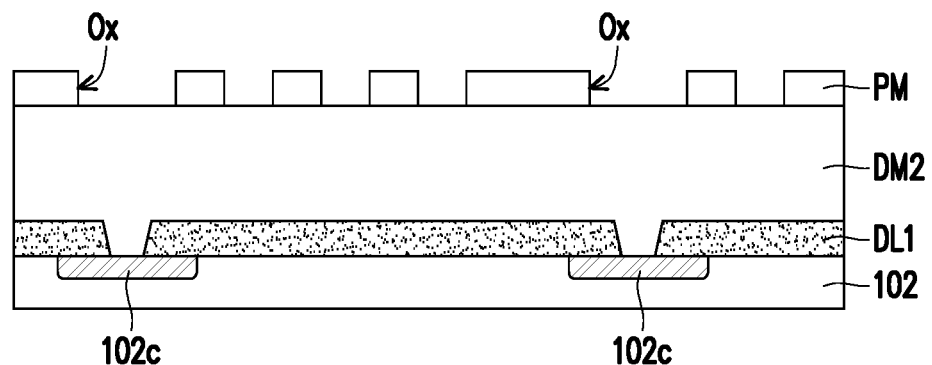
Figure 1D:
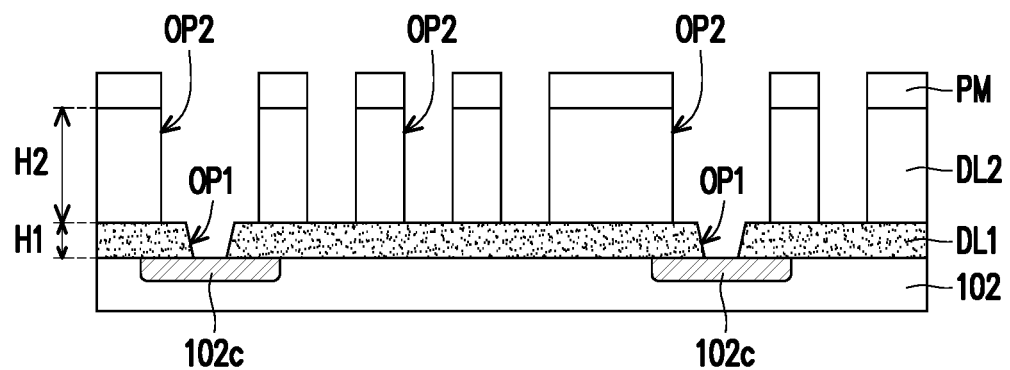

Referring to FIG. 1C, in a next step, a photomask PM having a plurality of opening patterns Ox is disposed on the second dielectric material DM2. In some embodiments, the photomask PM is a silylated silicon-containing photomask. The silylated photomask is adopted to achieve high dry-etching selectivity between the photomask PM and the second dielectric material DM2. Subsequently, referring to FIG. 1D, the second dielectric material DM2 is patterned to form a second dielectric material layer DL2 having a plurality of second openings OP2 that expose portions of the first dielectric material layer DL1. In some embodiments, the second dielectric material layer DL2 is formed by removing portions of the second dielectric material DM2 not covered by the photomask PM through an etching process. For example, in some embodiments, the etching process is performed by using $O_2$ with $CF_4$, or $O_2$ with $SF_6$ for etching the second dielectric material DM2 to define the second openings OP2. After the etching process, the second dielectric material layer DL2 is defined, wherein a height H1 of the first dielectric material layer DL1 is smaller than a height H2 of the second dielectric material layer DL2. In certain embodiments, a ratio of the height H1 to the height H2 is in a range of 1:2 to 1:6.

Furthermore, in some embodiments, a portion of the second openings OP2 formed in the second dielectric material layer DL2 overlaps with the first openings OP1 formed in the first dielectric material layer DL1. In other words, some of the second openings OP2 also expose the contacts 102C of the substrate 102 located underneath. In certain embodiments, the other second openings OP2 not overlapped with the first openings OP1 will expose a top surface of the first dielectric material layer DL1. In the exemplary embodiment, since a material of the first dielectric material layer DL1 (photosensitive material) is different than a material of the second dielectric material layer DL2 (non-photosensitive material), the first dielectric material layer DL1 may act as an etch-stop layer during the etching process of the second dielectric material DM2.

Figure 1E:
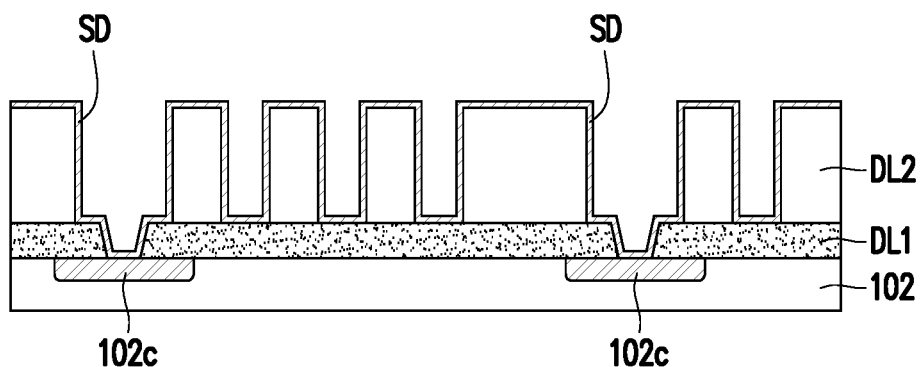

Referring to FIG. 1E, after forming the second dielectric material layer DL2, the photomask PM is stripped by, for example, etching, ash or other suitable removal processes. Thereafter, a seed layer SD is conformally formed over the first dielectric material layer DL1, the second dielectric material layer DL2 and within the first openings OP1 and the second openings OP2. In some embodiments, the seed layer SD covers and is in contact with top surfaces and side walls of the first dielectric material layer DL1, and covers and is in contact with top surfaces and side walls of the second dielectric material layer DL2. In one embodiment, the seed layer SD covers and is in contact with the exposed surfaces of the contacts 102C. In some embodiments, the seed layer SD is formed by chemical vapor deposition (CVD), physical vapor deposition (PVD), atomic layer deposition (ALD), high density plasma CVD (HDPCVD) or combinations thereof. In certain embodiments, the seed layer SD is formed by sequentially depositing or sputtering a titanium layer and a copper layer (not shown).

Figure 1F:
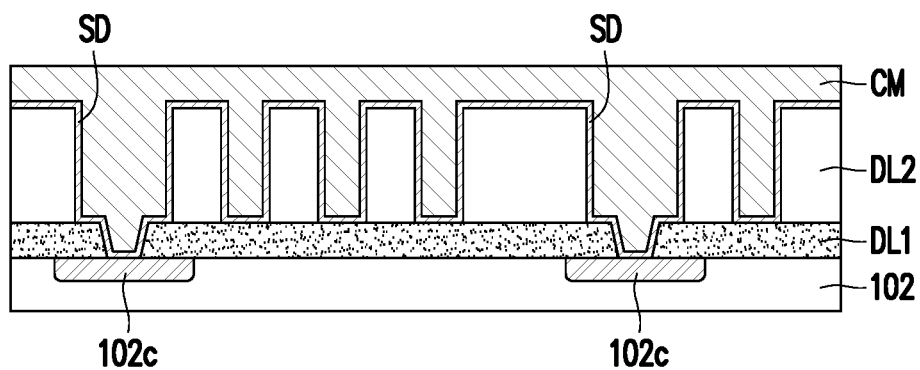

Referring to FIG. 1F, a conductive material CM is formed on the seed layer SD and over the first dielectric material layer DL1 and the second dielectric material layer DL2. In some embodiments, the conductive material CM fills up the first openings OP1 and the second openings OP2. In certain embodiments, the conductive material CM covers the top surfaces of the first dielectric material layer DL1 and the second dielectric material layer DL2. In some embodiments, the formation of the conductive material CM includes forming a copper layer or a copper alloy layer (not shown) on the seed layer SD by electroplating to fill up the first openings OP1 and the second openings OIP2. In certain embodiments, the conductive material CM is formed by a chemical vapor deposition (CVD) process, an electrochemical plating (ECP) process or even a sputtering process. However, the scope of this disclosure is not limited to the materials and descriptions disclosed above.

Figure 1G:
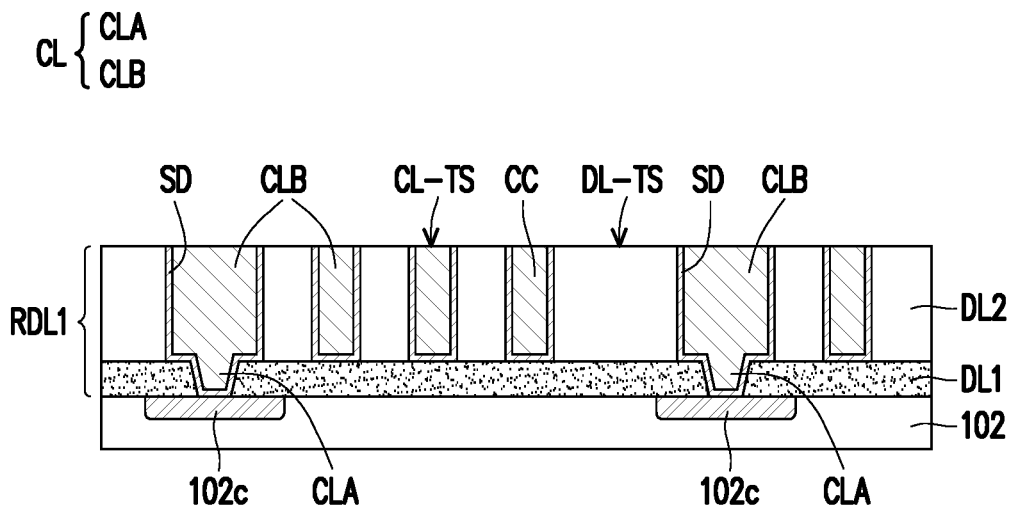

Referring to FIG. 1G, in a next step, a planarization process is performed so that portions of the conductive material CM is removed to form a conductive material layer CL. In some embodiments, the conductive material CM and the seed layer SD is ground or polished by a mechanical grinding process and/or a chemical mechanical polishing (CMP) process until a top surface DL-TS of the second dielectric material layer DL2 and a top surface CL-TS of the conductive material layer CL are revealed. In certain embodiments, after the planarization process, the top surface DL-TS of the second dielectric material layer DL2 is substantially coplanar with the top surface CL-TS of the conductive material layer CL.

In the exemplary embodiment, the conductive material layer CL is formed with via portions CLA and body portions CLB. For example, the via portions CLA are the portions that fill into the first openings OP1 of the first dielectric material layer DL1, and the body portions CLB are the portions that fill into the second openings OP2 of the second dielectric material layer DL2. In some embodiments, the seed layer SD is disposed in between the first dielectric material layer DL1 and the via portions CLA of the conductive material layer CL, and disposed in between the second dielectric material layer DL2 and the body portions CLB of the conductive material layer CL. In certain embodiments, the seed layer SD covers sidewalls of the via portions CLA and covers sidewalls of the body portions CLB. Furthermore, in some embodiments, a height to width aspect ratio of the conductive material layer CL is in a range of 2:1 to 6:1. Up till here, a first redistribution layer RDL1 of a redistribution structure is prepared. For example, the first dielectric material layer DL1, the second dielectric material layer DL2, the seed layer SD and the conductive material layer CL constitute the first redistribution layer RDL1. In the exemplary embodiment, the first redistribution layer RDL1 has a high aspect ratio pattern with a dual-damascene structure. Furthermore, the redistribution layer RDL1 is formed with the conductive material layer CL having line width/spacing of one micrometers/one micrometers or less.

Figure 1H:
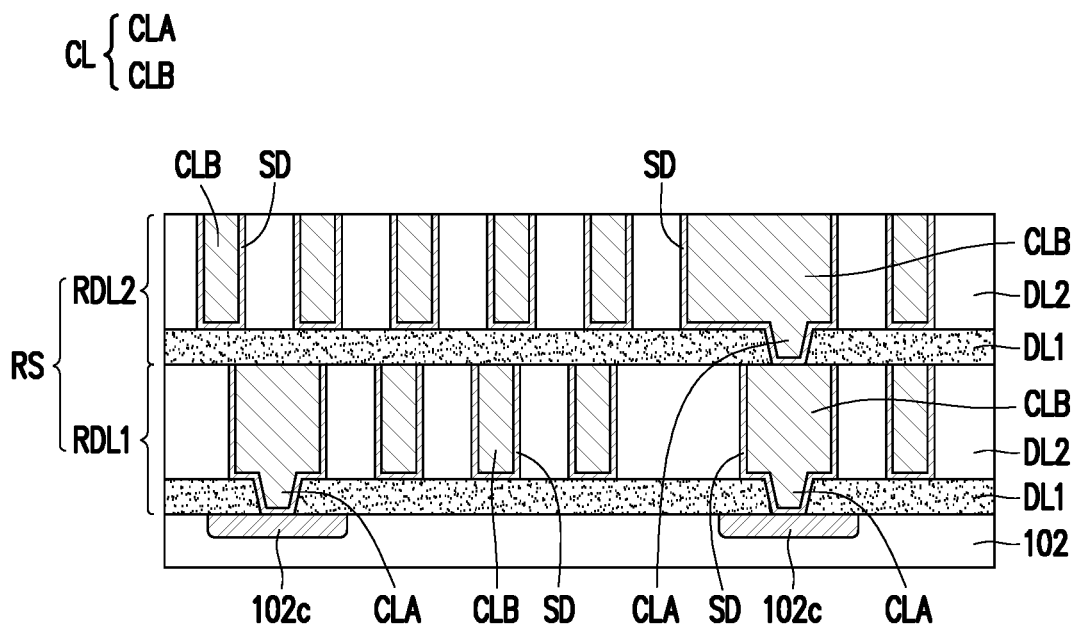

Referring to FIG. 1H, the steps shown in FIG. 1A to FIG. 1G may be repeated to form a second redistribution layer RDL2 over the first redistribution layer RDL1. For example, a first dielectric material layer DL1, a second dielectric material layer DL2 and a conductive material layer CL of the second redistribution layer RDL2 is formed in the same way as described for the first redistribution layer RDL1. For example, in some embodiments, the second redistribution layer RDL2 is formed by first forming the first dielectric material layer DL1 over the top surface CL-TS of the conductive material layer CL, and over the top surface DL-TS of the second dielectric material layer DL2. The first dielectric material layer DL1 of the second redistribution layer RDL2 has openings that reveal the conductive material layer CL of the first redistribution layer RDL1. Thereafter, a second dielectric material layer DL2 having openings that expose portions of the first dielectric material layer DL1 is formed over the first dielectric material layer DL1. Subsequently, a seed layer SD and a conductive material layer CL are sequentially formed in the openings of the first dielectric material layer DL1 and the second dielectric material layer DL2 to complete the formation of the second redistribution layer RDL2. In the exemplary embodiment, a redistribution structure RS having two redistribution layers (RDL1, RDL2) is formed. However, the disclosure is not limited thereto. In some other embodiments, the number of redistribution layers formed in the redistribution structure RS may be adjusted based on product requirement.

Figure 1I:
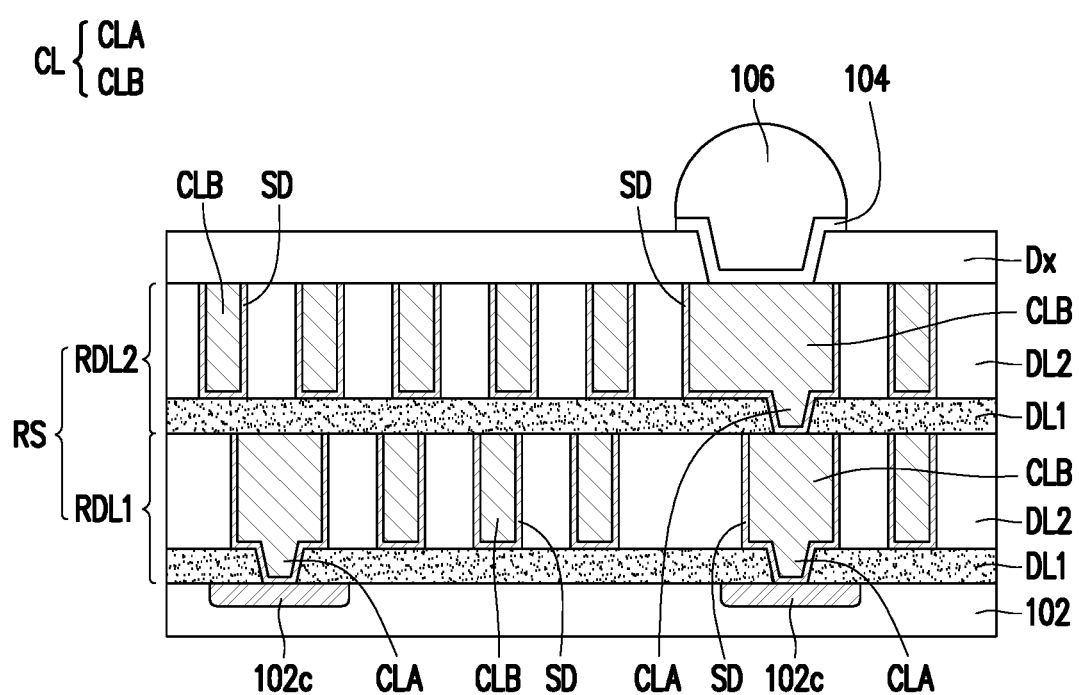

Referring to FIG. 1I, after forming the redistribution structure RS, a dielectric layer Dx may be formed over the redistribution structure RS to cover the second redistribution layer RDL2. In some embodiments, the dielectric layer Dx has openings that reveal the body portions CLB of the conductive material layer CL. Subsequently, a conductive pad 104 may be disposed on an exposed top surface of the conductive material layer CL over the dielectric layer Dx. In some embodiments, the conductive pad 104 is, for example, under-ball metallurgy (UBM) patterns used for ball mount. In some embodiments, the materials of the conductive pad 104 may include copper, nickel, titanium, tungsten, or alloys thereof or the like, and may be formed by an electroplating process, for example. After forming the conductive pad 104, a conductive ball 106 may be disposed on the conductive pad 104 over the redistribution structure RS. In some embodiments, the conductive ball 106 is, for example, solder balls or ball grid array (BGA) balls. In certain embodiments, the conductive ball 106 is electrically connected to the conductive material layer CL of the redistribution structure RS through the conductive pad 104. Although only one conductive ball 106 is illustrated in the embodiment, however, the disclosure is not limited thereto. It should be noted that the number of conductive ball 106 disposed on the redistribution structure RS may be adjusted based on design requirements.

In the above embodiments, a method of fabricating a redistribution structure RS on the substrate 102 is described. The substrate 102 may be any types of substrates seen in integrated fan-out packages, fan-in packages, or other types of packages having a redistribution structure. The disclosure is not limited thereto. An example of forming the redistribution structure RS in integrated fan-out packages will be described next.

Figure 2A:
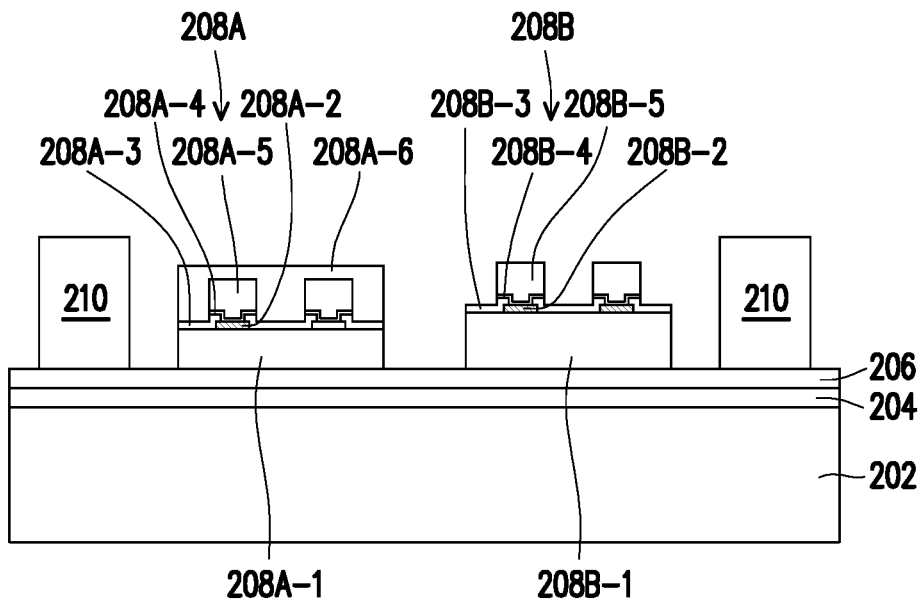
FIG. 2A to FIG. 2F are schematic cross-sectional view of various stages in a method of fabricating a semiconductor package according to some exemplary embodiments of the present disclosure.

FIG. 2A to FIG. 2F are schematic cross-sectional view of various stages in a method of fabricating a semiconductor package according to some exemplary embodiments of the present disclosure. Referring to FIG. 2A, a carrier 202 having a d-bonding layer 204 and a dielectric layer 206 formed thereon is provided. The de-bonding layer 204 is located in between the carrier 202 and the dielectric layer 206. In some embodiments, the carrier 202 may be a glass carrier, a ceramic carrier, or any suitable carrier for carrying a semiconductor wafer or a reconstituted wafer used for the method of fabricating the package structure. In some embodiments, the de-bonding layer 204 may be formed of a polymer-based material (such as a Light to Heat Conversion (LTHC) material), which may be removed along with the carrier 202 from the overlying structures by applying laser irradiation. In some other embodiments, the de-bonding layer 204 may be formed of an epoxy-based thermal release material.

In the exemplary embodiment, the dielectric layer 206 is formed on the de-bonding layer 204. The dielectric layer 206 may, for example, be made of dielectric materials such as benzocyclobutene ("BCB"), polybenzoxazole ("PBO"), or any other suitable polymer-based dielectric materials that may be easily patterned using a photo-lithography process. In some alternative embodiments, the dielectric layer 206 is formed of a nitride such as silicon nitride, an oxide such as silicon oxide, or the like. It is noted that the materials of the carrier 202, the de-bonding layer 204 and the dielectric layer 206 are not limited to the descriptions of the embodiments. In some alternative embodiments, the dielectric layer 206 may be omitted; in other words, merely the de-bonding layer 204 is formed over the carrier 202.

After forming the de-bonding layer 204 and the dielectric layer 206, a first semiconductor die 208A, a second semiconductor die 208B and a plurality of through insulator vias 210 are provided on the dielectric layer 206 over the carrier 202. In some embodiments, the through insulator vias 210 are through integrated fan-out ("InFO") vias. In one embodiment, the formation of the through insulator vias 210 includes forming a mask pattern (not shown) with openings, then forming a metallic material (not shown) filling up the openings by electroplating or deposition, and removing the mask pattern to form the through insulator vias 210 on the carrier 202. In one embodiment, the material of the through insulator vias 210 may include a metal material such as copper or copper alloys, or the like. However, the disclosure is not limited thereto. In an alternative embodiment, the through insulator vias 210 may be formed by forming a seed layer (not shown) on the dielectric layer 206; forming the mask pattern with openings exposing portions of the seed layer; forming the metallic material on the exposed portions of the seed layer to form the through insulator vias 210 by plating; removing the mask pattern; and then removing portions of the seed layer exposed by the through insulator vias 210. For example, the seed layer may be a titanium/copper composited layer.

Furthermore, as illustrated in FIG. 2A, the first semiconductor die 208A and the second semiconductor die 208B are placed on the dielectric layer 206. The first semiconductor die 208A and the second semiconductor die 208B may be the same types of die or different type of dies. For example, the first semiconductor die 208A and the second semiconductor die 208B may be application-specific integrated circuit ("ASIC") dies, high bandwidth memory (HBM) dies, sensor dies, wireless and radio frequency dies, memory dies, logic dies or voltage regulator dies. The disclosure is not limited thereto.

In some embodiments, the first semiconductor die 208A and the second semiconductor die 208B are attached or adhered on the dielectric layer 206 through a die attach film (DAF), an adhesion paste (not shown) or the like. In some embodiments, the first semiconductor die 208A and the second semiconductor die 208B includes a semiconductor substrate (208A-1, 208B-1), a plurality of conductive pads (208A-2, 208B-2), a passivation layer (208A-3, 208B-3), seed layers (208A-4, 208B-4) and a plurality of conductive vias (208A-5, 208B-5). In certain embodiments, the first semiconductor die 208A further includes a protection layer 208A-6.

As illustrated in FIG. 2A, the plurality of conductive pads (208A-2, 208B-2) is disposed on the semiconductor substrate (208A-1, 208B-1). The passivation layer (208A-3, 208B-3) is formed over the semiconductor substrate (208A-1, 208B-1) and has openings that partially expose the conductive pads (208A-2, 208B-2) on the semiconductor substrate (208A-1, 208B-1). The semiconductor substrate (208A-1, 208B-1) may be a bulk silicon substrate or a silicon-on-insulator (SOI) substrate, and further includes active components (e.g., transistors or the like) and optionally passive components (e.g., resistors, capacitors, inductors or the like) formed therein. In some embodiments, a thickness of the semiconductor substrate 208A-1 of the first semiconductor die 208A is different than a thickness of the semiconductor substrate 208B-1 of the second semiconductor die 208B. In some embodiments, the conductive pads (208A-2, 208B-2) may be aluminum pads, copper pads or other suitable metal pads. The passivation layer (208A-3, 208B-3) may be a silicon oxide layer, a silicon nitride layer, a silicon oxy-nitride layer or a dielectric layer formed of any suitable dielectric materials.

Furthermore, in some embodiments, the seed layers (208A-4, 208B-4) are disposed in the openings of the passivation layer (208A-3, 208B-3) over the conductive pads (208A-2, 208B-2). In certain embodiments, the conductive vias (208A-5, 208B-5) are formed on the seed layers (208A-4, 208B-4) by plating. In some embodiments, the seed layers (208A-4, 208B-4) are formed by sequentially depositing or sputtering a titanium layer and a copper layer. In some embodiments, the conductive vias (208A-5, 208B-5) may be formed of suitable materials such as copper, copper alloys, or the like. In certain embodiments, the first semiconductor die 208A further includes a protection layer 208A-6 disposed over the passivation layer 208A-3 and covering the conductive vias 208A-5. In some embodiments, the protection layer 208A-6 may be a polybenzoxazole (PBO) layer, a polyimide (PI) layer or other suitable polymers. In some alternative embodiments, the protection layer 208A-6 may be made of inorganic materials.

In the exemplary embodiment, the first semiconductor die 208A and the second semiconductor die 208B placed on the dielectric layer 206 may be arranged in an array, and when the first semiconductor die 208A and the second semiconductor die 208B are arranged in an array, the through insulator vias 210 may be classified into groups. The number of the semiconductor dies (208A/208B) may correspond to the number of the groups of the through insulator vias 210. In the illustrated embodiment, the first semiconductor die 208A and the second semiconductor die 208B may be picked and placed on the dielectric layer 206 after the formation of the through insulator vias 210. However, the disclosure is not limited thereto. In some alternative embodiments, the first semiconductor die 208A and the second semiconductor die 208B may be picked and placed on the dielectric layer 206 before the formation of the through insulator vias 210.

Figure 2B:
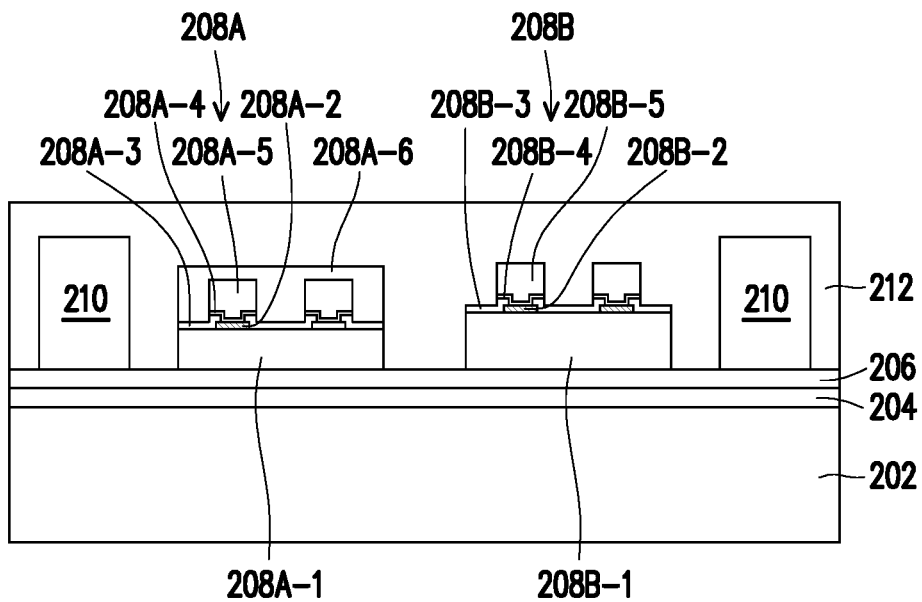

Referring to FIG. 2B, after forming the through insulator vias 210 and providing the semiconductor dies (208A/208B), an insulting material 212 is formed on the dielectric layer 206 covering the through insulator vias 210 and the semiconductor dies (208A/208B). In some embodiments, the insulating material 212 is formed through, for example, a compression molding process, filling up the gaps between the semiconductor dies (208A/208B) and adjacent through insulator vias 210 to encapsulate the semiconductor dies (208A/208B). The insulating material 212 also encapsulates the through insulator vias 210. In some embodiments, the conductive vias (208A-5, 208B-5) and the protection layer 208A-6 of the semiconductor dies (208A/208B) are encapsulated by and well protected by the insulating material 212. In other words, the conductive vias (208A-5, 208B-5) and the protection layer 208A-6 are not revealed and are well protected by the insulating material 212.

In some embodiments, the insulating material 212 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 212 may include an acceptable insulating encapsulation material. In some embodiments, the insulating material 212 may further include inorganic filler or inorganic compound (e.g. silica, clay, and so on) which can be added therein to optimize coefficient of thermal expansion (CTE) of the insulating material 212. The disclosure is not limited thereto.

Figure 2C:
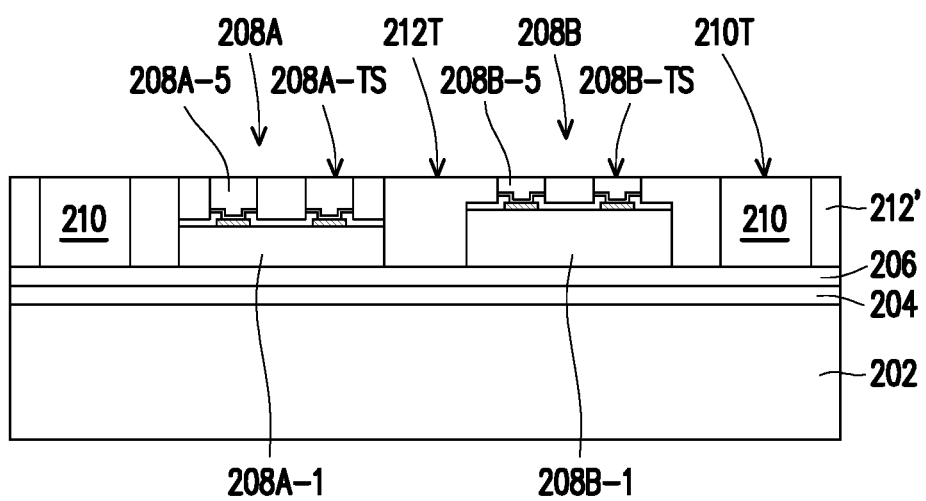

Referring to FIG. 2C, in a next step, the insulating material 212 and the protection layer 208A-6 of the first semiconductor die 208A are ground or polished by a mechanical grinding process and/or a chemical mechanical polishing (CMP) process until the top surfaces (208A-TS/208B-TS) of the conductive vias (208A-5, 208B-5) are revealed. In some embodiments, the through insulator vias 210 and the conductive vias 208B-5 of the second semiconductor die 208B may be partially polished so that the top surfaces 210T of the through insulator vias 210 are leveled with top surfaces (208A-TS/208B-TS) of the conductive vias (208A-5, 208B-5). The insulating material 212 is polished to form an insulating encapsulant 212'. In some embodiments, the top surface 212T of the insulating encapsulant 212' is coplanar with the top surfaces 210T of the through insulator vias 210 and the top surfaces (208A-TS/208B-TS) of the conductive vias (208A-5, 208B-5).

Figure 2D:
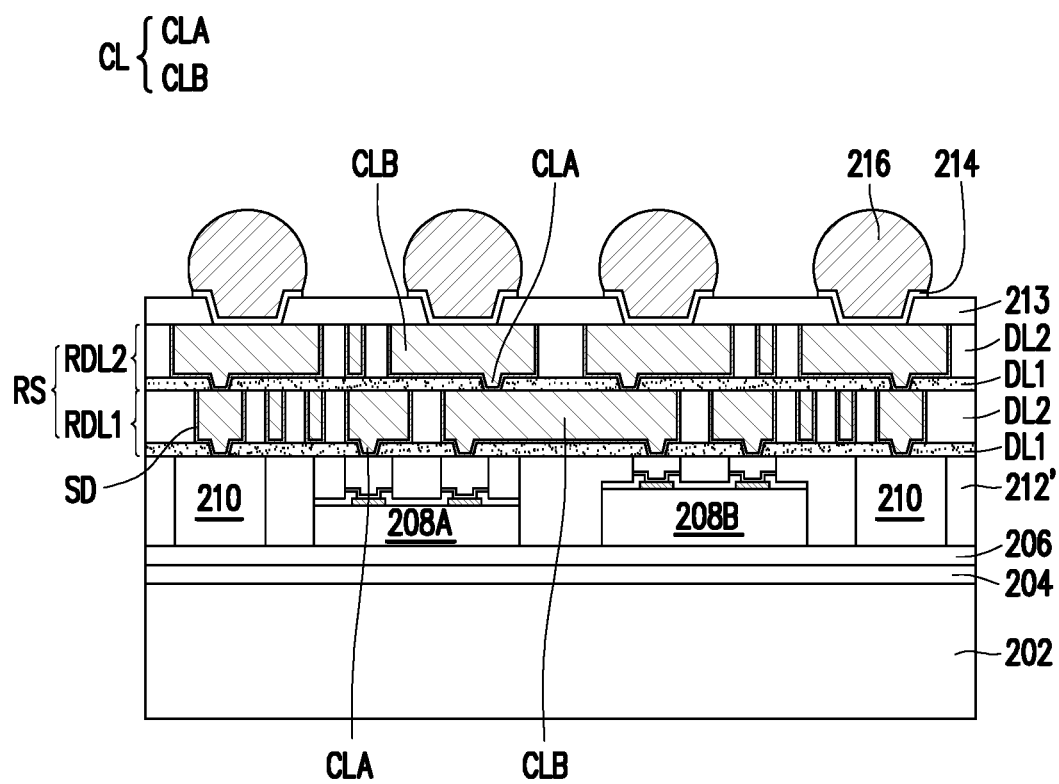

Referring to FIG. 2D, after forming the insulating encapsulant 212', a redistribution structure RS is formed over the insulating encapsulant 212'. The method of forming the redistribution structure RS is similar to the method described in the embodiment of FIG. 1A to FIG. 1I. Therefore, the same reference numerals are used to refer to the same or liked parts and its detailed description is omitted herein. In brief, the redistribution structure RS is formed by the following steps. For example, a first dielectric material (not shown) is formed over the insulating encapsulant 212', wherein the first dielectric material is patterned to form a first dielectric material layer DL1 having openings that expose the contacts (conductive vias 208A-5, 208B-5) of the semiconductor dies (208A/208B). A second dielectric material (not shown) is then formed on the first dielectric material layer DL1, wherein the second dielectric material is patterned to form a second dielectric material layer DL2 having openings that expose portions of the first dielectric material layer DL1. In the exemplary embodiment, the second dielectric material (non-photosensitive material) is different than the first dielectric material (photosensitive material). In a next step, a seed layer SD is conformally formed over the first dielectric material layer DL1 and the second dielectric material layer DL2 and within the openings of the first dielectric material layer DL1 and the second dielectric material layer DL2. Subsequently, a conductive material layer CL having via portions CLA and body portions CLB is formed, wherein the via portions CLA fill into the openings of the first dielectric material layer DL1, and the body portions CLB fill into the openings of the second dielectric material layer DL2. In some embodiments, the first dielectric material layer DL1, the second dielectric material layer DL2, the seed layer SD and the conductive material layer CL constitute one redistribution layer (first redistribution layer RDL1).

The formation of the first dielectric material layer DL1, the second dielectric material layer DL2, the seed layer SD and the conductive material layer CL may be repeated to form a redistribution structure RS having a plurality of redistribution layers. For example, in the illustrated embodiment, a first redistribution layer RDL1 and a second redistribution layer RDL are formed. In some embodiments, the formed redistribution structure RS is electrically connected to the conductive vias (208A-5, 208B-5) of the semiconductor dies (208A/208B), and electrically connected to the through insulator vias 210. For example, the connection is made through the via portions CLA of the conductive material layer CL. After forming the redistribution structure RS with the desired number of redistribution layers, a dielectric layer 213 may be disposed on the topmost redistribution layer (RDL2), wherein the dielectric layer 213 has openings that reveal the body portions CLB of the conductive material layer CL. Subsequently, a plurality of conductive pads 214 may be disposed on an exposed top surface of the conductive material layer CL over the dielectric layer 213. After forming the conductive pads 214, a plurality of conductive balls 216 may be disposed on the conductive pads 214 over the redistribution structure RS. The materials of the conductive pads 214 and the conductive balls 216 may be similar to the conductive pad 104 and the conductive ball 106 described in FIG. 1I, and its detailed description will be omitted herein.

Figure 2E:
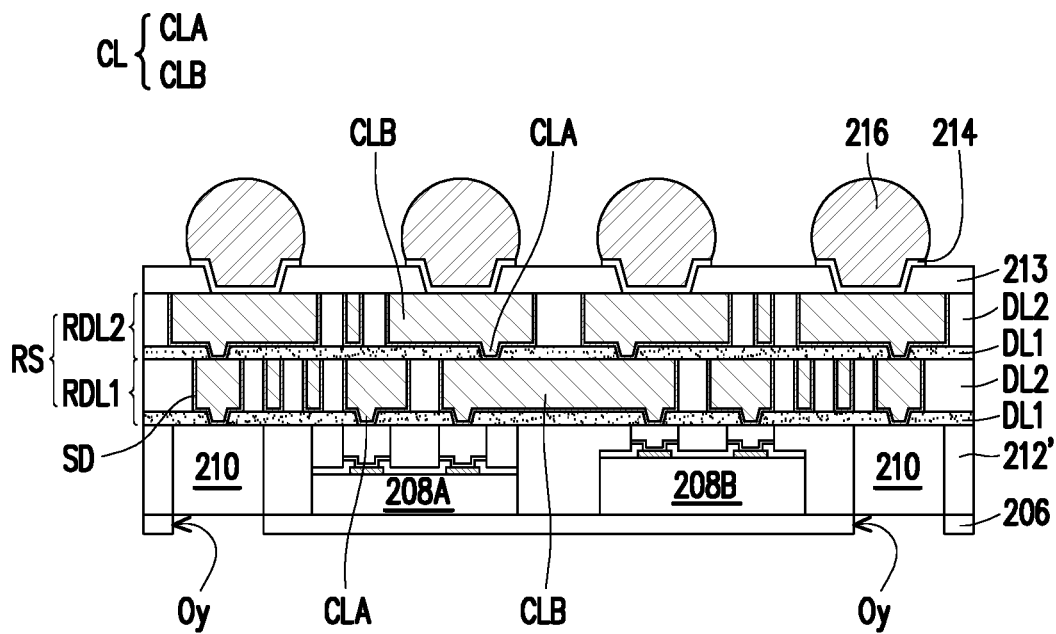

Referring to FIG. 2E, after the conductive balls 216 are disposed on the redistribution structure RS, the dielectric layer 206 is de-bonded from the de-bonding layer 204. For example, the dielectric layer 206 is separated from the de-bonding layer 204 and the carrier 202. In some embodiments, the de-bonding layer 204 (e.g., the LTHC release layer) may be irradiated by an UV laser such that the dielectric layer 206 is peeled from the carrier 202. In certain embodiments, the de-bonding layer 204 may be further removed or peeled off so that de-bonding layer 204 is separated from the dielectric layer 206. As shown in FIG. 2E, the remaining dielectric layer 206 may then be patterned to form a plurality of openings Oy that expose the bottom surfaces of the through insulator vias 210. The number of openings Oy formed is corresponding to the number of the through insulator vias 210.

Figure 2F:
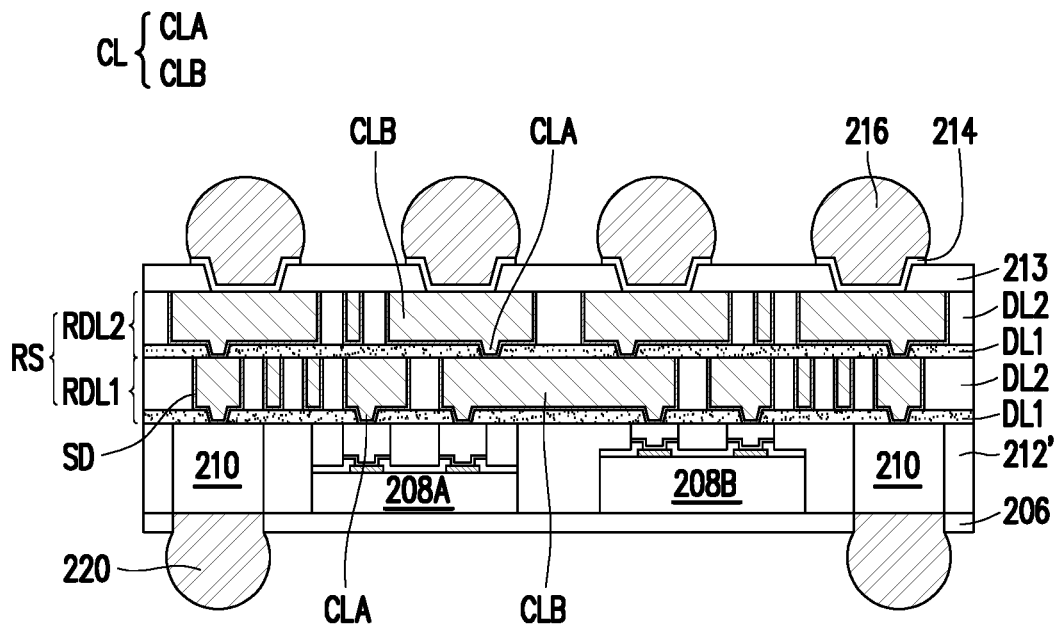

Referring to FIG. 2F, after the openings Oy are formed on the dielectric layer 206, a plurality of conductive balls 220 is placed on the bottom surface of the through insulator vias 210 exposed by the openings Oy. The conductive balls 220 are, for example, reflowed to bond with the bottom surfaces of the through insulator vias 210. After the conductive balls 220 are formed, a package structure having dual-side terminals is accomplished.

In the above embodiments, the redistribution structure of the semiconductor package is formed with a plurality of redistribution layers, wherein each of the redistribution layer is at least formed with a first dielectric material layer, a second dielectric, and a conductive material layer. Since the redistribution layer is formed with the first dielectric material layer (photosensitive material) and the second dielectric material layer DL2 (non-photosensitive material), these rigid and cured dielectric layers may be used to construct a redistribution layer pattern having a high aspect ratio though simple dry etching processes. As such, a collapse risk of the redistribution structure can be significantly decreased. Furthermore, by having seed layers covering the sidewalls of the conductive material layer, good sidewall adhesion and reliability can be achieved. Overall, the method is feasible for obtaining fine-pitch redistribution structures, and to achieve a high aspect-ratio target.

In some embodiments of the present disclosure, a semiconductor package including a substrate and a redistribution structure is provided. The substrate has at least one contact. The redistribution structure is disposed on the substrate and electrically connected to the at least one contact. The redistribution structure includes a plurality of redistribution layers, and each of the redistribution layers includes a conductive material layer, a first dielectric material layer and a second dielectric material layer. The conductive material layer has via portions and body portions located on the via portions. The first dielectric material layer is surrounding the via portions of the conductive material layer. The second dielectric material layer is disposed on the first dielectric material layer and surrounding the body portions of the conductive material layer, wherein a material of the second dielectric material layer is different than a material of the first dielectric material layer.

In some other embodiments of the present disclosure, a method of fabricating a semiconductor package is described. The method includes the following steps. A substrate having contacts is provided. A redistribution structure is formed over the substrate and electrically connected to the contacts. The method of forming the redistribution structure includes the following steps. A first dielectric material is formed on the substrate. The first dielectric material is patterned to form a first dielectric material layer having a plurality of first openings that expose the contacts of the substrate. A second dielectric material is formed on the first dielectric material layer. The second dielectric material is patterned to form a second dielectric material layer having a plurality of second openings that expose portions of the first dielectric material layer. A conductive material layer having via portions and body portions is formed. The via portions fill into the first openings of the first dielectric material layer, and the body portions fill into the second openings of the second dielectric material layer. The formation of the first dielectric material layer, the second dielectric material layer and the conductive material layer is repeated to form the redistribution structure having a plurality of redistribution layers.

In yet another embodiment of the present disclosure, a method of fabricating a semiconductor package is described. The method includes the following steps. A carrier is provided. At least one semiconductor die is bonded on the carrier, wherein the semiconductor die has a plurality of contacts. A plurality of through insulator vias is formed to surround the semiconductor die. An insulating encapsulant is formed to encapsulate the semiconductor die and the plurality of through insulator vias. A redistribution structure is formed over the insulating encapsulant, herein the redistribution structure is electrically connected to the contacts of the semiconductor die and electrically connected to the through insulator vias. The method forming the redistribution structure includes the following steps. A first dielectric material is formed over the insulating encapsulant. The first dielectric material is patterned to form a first dielectric material layer having a plurality of first openings that expose the contacts of the semiconductor die. A second dielectric material is formed on the first dielectric material layer. The second dielectric material is patterned to form a second dielectric material layer having a plurality of second openings that expose portions of the first dielectric material layer. The second dielectric material is different than the first dielectric material. A conductive material layer having via portions and body portions is formed. The via portions fill into the first openings of the first dielectric material layer, and the body portions fill into the second openings of the second dielectric material layer. The formation of the first dielectric material layer, the second dielectric material layer and the conductive material layer is repeated to form the redistribution structure having a plurality of redistribution layers. A plurality of conductive balls is formed over the redistribution structure, wherein the plurality of conductive balls is electrically connected to the redistribution structure. The carrier is then de-bonded.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor package, comprising:
    providing a semiconductor die on a carrier, wherein the semiconductor die has a plurality of contacts;
    forming an insulating encapsulant encapsulating the semiconductor die; and
    forming a redistribution structure over the insulating encapsulant and electrically connected to the plurality of contacts, wherein the method of forming the redistribution structure comprises:
        forming a plurality of first dielectric materials layers with a first height and a plurality of second dielectric material layers with a second height, wherein a ratio of the first height to the second height is in a range of 1:2 to 1:6, and the plurality of first dielectric materials layers and the plurality of second dielectric material layers are alternately stacked up over the insulating encapsulant so that each of the plurality of first dielectric materials layers are separated from one another and each of the plurality of second dielectric materials are separated from one another; and
        forming a plurality of conductive material layers having via portions and body portions embedded within the plurality of first dielectric material layers and the plurality of second dielectric material layers, wherein the plurality of first dielectric material layers with the first height surround the via portions and the plurality of second dielectric material layers with the second height surround the body portions;
    and in the semiconductor package, sidewalls of the plurality of first dielectric material layers are aligned with sidewalls of the plurality of second dielectric material layers and sidewalls of the insulating encapsulant.

2. The method of fabricating the semiconductor package according to claim 1, wherein the plurality of first dielectric material layers is a photosensitive dielectric material layer, and the plurality of second dielectric material layers is a non-photosensitive dielectric material layer.

3. The method of fabricating the semiconductor package according to claim 2, wherein the plurality of first dielectric material layers is Si-containing oxides or Ti-containing oxides, and the plurality of second dielectric material layers is a non-photosensitive polyimide or polybenzooxazole.

4. The method of fabricating the semiconductor package according to claim 1, wherein the method of forming the redistribution structure further comprises:
    forming a seed layer conformally over the plurality of first dielectric material layers, the plurality of second dielectric material layers prior to forming the plurality of conductive material layers.

5. The method of fabricating the semiconductor package according to claim 1, wherein a plurality of second dielectric materials is formed on the plurality of first dielectric material layers by lamination, and the plurality of second dielectric materials is patterned by providing a photomask over the plurality of second dielectric materials, then performing dry etching on the plurality of second dielectric materials exposed by openings of the photomask to form the plurality of second dielectric material layers, and removing the photomask.

6. The method of fabricating the semiconductor package according to claim 1, wherein the plurality of conductive material layers is formed by forming a conductive material over the plurality of first dielectric material layers, the plurality of second dielectric material layers and within first openings of the plurality of first dielectric material layers and second openings of the plurality of second dielectric material layers, then performing a planarization process to remove portions of the conductive material to form the plurality of conductive material layers.

7. The method of fabricating the semiconductor package according to claim 6, wherein a top surface of one of the plurality of second dielectric material layers is coplanar with a top surface of one of the plurality of conductive material layers after the planarization process.

8. The method of fabricating the semiconductor package according to claim 1, wherein the plurality of conductive material layers is formed with a height to width aspect ratio of 2:1 to 6:1.

9. A method of fabricating a semiconductor package, comprising:
    providing a carrier;
    bonding at least one semiconductor die on the carrier, wherein the at least one semiconductor die has a plurality of contacts and a protection layer surrounding the plurality of contacts;
    forming a plurality of through insulator vias surrounding the at least one semiconductor die;
    forming an insulating encapsulant encapsulating the at least one semiconductor die and the plurality of through insulator vias, wherein a top surface of the protection layer is coplanar with a top surface of the insulating encapsulant and a top surface of the plurality of through insulator vias;
    forming a redistribution structure over the insulating encapsulant, wherein the redistribution structure is electrically connected to the plurality of contacts of the at least one semiconductor die and electrically connected to the through insulator vias, and the method of forming the redistribution structure comprises:
        after forming the insulating encapsulant, forming a first dielectric material over the top surface of the insulating encapsulant, and patterning the first dielectric material to form a first dielectric material layer having a plurality first openings that expose the plurality of contacts of the at least one semiconductor die;
        forming a second dielectric material on a top surface of the first dielectric material layer, and patterning the second dielectric material to form a second dielectric material layer having a plurality of second openings that expose portions of the first dielectric material layer, wherein the second dielectric material is different from the first dielectric material;
        forming a conductive material filling into the plurality of first openings and the plurality of second openings and covering a top surface of the first dielectric material layer and a top surface of the second dielectric material layer;

performing a planarization process removing portions of the conductive material to form a conductive material layer having via portions and body portions, wherein the via portions fill into the first openings of the first dielectric material layer, and the body portions fill into the second openings of the second dielectric material layer, and a top surface of the conductive material layer is coplanar with the top surface of the second dielectric material layer after the planarization process; and repeating the formation of the first dielectric material layer, the second dielectric material layer and the conductive material layer to form the redistribution structure having a plurality of redistribution layers;

forming a plurality of conductive balls over the redistribution structure, wherein the plurality of conductive balls is electrically connected to the redistribution structure; and de-bonding the carrier.

10. The method of fabricating the semiconductor package according to claim 9, wherein the first dielectric material layer is a photosensitive dielectric material layer, and the second dielectric material layer is a non-photosensitive dielectric material layer.

11. The method of fabricating the semiconductor package according to claim 9, wherein the method of forming the redistribution structure further comprises:

forming a seed layer conformally over the first dielectric material layer, the second dielectric material layer and within the first openings and the second openings prior to forming the conductive material layer.

12. The method of fabricating the semiconductor package according to claim 9, wherein the second dielectric material is formed on the first dielectric material layer by lamination, and the second dielectric material is patterned by providing a photomask over the second dielectric material, then performing dry etching on the second dielectric material exposed by openings of the photomask to form the second dielectric material layer, and removing the photomask.

13. The method of fabricating the semiconductor package according to claim 9, wherein the conductive material layer is formed by forming a conductive material over the first dielectric material layer, the second dielectric material layer and within the first openings and the second openings, then performing a planarization process to remove portions of the conductive material to form the conductive material layer.

14. A method of fabricating a semiconductor package, comprising:

providing a first semiconductor die having a plurality of contacts and a protection layer surrounding the plurality of contacts;

providing a second semiconductor die having a plurality of second contacts;

forming an insulating encapsulant surrounding the first semiconductor die and the second semiconductor die, wherein a top surface of the insulating encapsulant is aligned with top surfaces of the protection layer, the plurality of contacts and the plurality of second contacts, and the insulating encapsulant is in physical contact with the protection layer and the plurality of second contacts;

forming a first redistribution layer on a top surface of the insulating encapsulant over the first semiconductor die and the second semiconductor die, wherein the first redistribution layer is electrically connected to the plurality of contacts and the plurality of second contacts, and the method of forming the first redistribution layer comprises:

forming a first dielectric material layer over the first semiconductor die and the second semiconductor die by a coating process, wherein the first dielectric material layer has first openings revealing the plurality of contacts and the plurality of second contacts;

forming a second dielectric material over the first dielectric material layer by lamination and curing processes;

performing an etching process on the second dielectric material using the first dielectric material layer as an etch-stop layer, and to form a second dielectric material layer having second openings overlapped with the first openings; and forming a conductive material layer filling into the first openings and the second openings, wherein the conductive material layer is electrically connected to the plurality of contacts and the plurality of second contacts.

15. The method of fabricating the semiconductor package according to claim 14, wherein the steps of forming the first dielectric material layer, the second dielectric material layer and the conductive material layer are repeated to form a second redistribution layer located over the first redistribution layer.

16. The method of fabricating the semiconductor package according to claim 14, wherein the first dielectric material layer is a photosensitive dielectric material layer, and the second dielectric material layer is a non-photosensitive dielectric material layer.

17. The method of fabricating the semiconductor package according to claim 14, wherein the method of forming the first redistribution layer further comprises:

forming a seed layer conformally over the first dielectric material layer, the second dielectric material layer and within the first openings and the second openings prior to forming the conductive material layer.

18. The method of fabricating the semiconductor package according to claim 14, wherein the second dielectric material layer is formed with a height greater than that of the first dielectric material layer.

19. The method of fabricating the semiconductor package according to claim 14, wherein the second dielectric material is formed on the first dielectric material layer by lamination, and the etching process is performed by providing a photomask over the second dielectric material, then performing dry etching on the second dielectric material exposed by openings of the photomask to form the second dielectric material layer, and removing the photomask.

20. The method of fabricating the semiconductor package according to claim 14, wherein the conductive material layer is formed with a height to width aspect ratio of 2:1 to 6:1.

* * * * *